(12) United States Patent
Ishibashi

(10) Patent No.: US 6,425,990 B1
(45) Date of Patent: Jul. 30, 2002

(54) METHOD FOR FABRICATING TRANSPARENT CONDUCTIVE ITO FILM

(75) Inventor: Keizi Ishibashi, Fuchu (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 08/508,563

(22) Filed: Jul. 28, 1995

(30) Foreign Application Priority Data

Sep. 9, 1994 (JP) .............................................. 6-242202

(51) Int. Cl.$^7$ .............................................. C23C 14/34
(52) U.S. Cl. ........................... 204/192.29; 204/192.13; 204/192.15
(58) Field of Search ....................... 204/192.13, 192.15, 204/192.29

(56) References Cited

U.S. PATENT DOCUMENTS

| | | | |
|---|---|---|---|
| 4,094,763 A | * 6/1978 | Gillery et al. | .......... 204/192.29 |
| 4,349,425 A | * 9/1982 | Miyake et al. | .......... 204/192.29 |
| 4,661,229 A | * 4/1987 | Hemming et al. | .. 204/192.29 X |
| 4,842,705 A | * 6/1989 | Mueller | .................. 204/192.29 |
| 4,936,964 A | * 6/1990 | Nakamura | .......... 204/192.29 X |
| 4,975,168 A | * 12/1990 | Ohno et al. | .......... 204/192.29 X |

FOREIGN PATENT DOCUMENTS

JP 2-47255 2/1990

OTHER PUBLICATIONS

Buchanan et al., "Influence . . . Indium Oxide", Thin Solid Films, 80(1981), 373–382.*
Fan et al., "Effect . . . films", Applied Physics Letter, vol. 31, No. 11, 12/77, pp. 773–775.*

* cited by examiner

*Primary Examiner*—Rodney G. McDonald
(74) *Attorney, Agent, or Firm*—Burns, Doane, Swecker & Mathis, LLP

(57) ABSTRACT

A method capable of fabricating a transparent conductive ITO film with a resistivity within a predetermined range until the end of the life of the target when transparent conductive ITO films are continuously formed on a plurality of substrates by continuous sputtering, and capable of fabricating a transparent conductive ITO film with a resistivity of within a predetermined range even when the film becomes thicker in forming it on a single substrate. It is a method for fabricating a transparent conductive ITO film which has In and O as basic component elements and with Sn added as a donor, in an atmosphere of mixture of rare gas and oxygen gas by a sputtering process using mixture of oxides of In and Sn wherein it comprises a first step of forming a transparent conductive ITO film on a substrate, and a second step of interrupting the first step and performing discharge in a state with the partial pressure of oxygen higher than that in the first step to compensate for the oxygen deficiency in the target, the first and second steps being alternately repeated.

13 Claims, 1 Drawing Sheet

METHOD FOR FABRICATING TRANSPARENT CONDUCTIVE ITO FILM

BACKGROUND OF THE INVENTION

1. Field of the Invention

The present invention relates to a method for fabricating a transparent conductive ITO (Indium Tin Oxide) film, and, more particularly, to a method for fabricating transparent conductive ITO film which is utilized as an electrode of a liquid crystal display device, a solar battery, or the like by using a sputtering process.

2. Description of the Prior Art

A transparent conductive ITO film has been known which contains indium (In) and oxygen (O) as the basic component elements and tin (Sn) is added as a donor. Conventional methods for fabricating the transparent conductive ITO film include chemical film formation processes such as a spray process, a chemical vapor deposition (CVD) process, and a wet dip process, and physical film formation processes such as a vacuum evaporation process, and a sputtering process.

Among the above thin film fabricating methods, the sputtering process is superior to the others in that it can provide a transparent conductive ITO film with a relatively low resistance, and uniformly form a transparent conductive ITO film on a large substrate such as a glass plate.

There are direct current (DC) discharge-type sputtering processes and radio frequency (RF) discharge-type sputtering processes. The direct current discharge sputtering process (called the "DC sputtering process") is conventionally used because it is inexpensive, provides stable discharge and has excellent controllability. A magnetron sputtering process is also conventionally used. This process converges plasma on the surface of a target with closed magnetic field generated by one or more magnets located behind the target. Because it has a high film formation rate, the magnetron sputtering process has excellent mass production capability. In view of the foregoing, a DC magnetron sputtering process which combines the direct current discharge process and the magnetron process is commonly currently used as the mass production apparatus for forming transparent conductive ITO films. Recently, a DC magnetron sputtering apparatus has been further developed to perform sputtering over the entire surface of the target by reciprocating (rocking) or eccentrically rotating the magnet located behind the target.

The sputtering process is known to have substrate temperature and oxygen partial pressure as factors affecting the resistivity of the resulting transparent conductive ITO film. As for the substrate temperature, a higher temperature provided a lower resistivity. For the oxygen partial pressure, on one hand the carrier density of the formed ITO film becomes higher in a region formed under a lower partial pressure because many oxygen vacancies exist in the film, while the mobility of the carriers becomes low. On the other hand, the carrier density of the ITO film formed in a region under higher partial pressure becomes lower as the number of oxygen vacancies decreases, while the mobility of carrier becomes higher. Because the resistivity is the inverse of the product of the carrier density and the mobility, there is optimal oxygen partial pressure where the resistivity is minimized in balancing between the carrier density and the mobility. Conventional sputtering processes have been used to fabricate a transparent conductive ITO film with low resistivity by adjusting the substrate temperature and the oxygen partial pressure as parameters. A sputtering process is disclosed in Japanese patent publication HEI 2-47255, herein incorporated by reference, wherein an oxide thin film is manufactured in a period in which only an inert gas (argon) is introduced and in other periods only oxygen gas is introduced.

SUMMARY OF THE INVENTION

In the conventional sputtering process, there is a problem that the resistivity of the transparent conductive ITO film formed on each substrate gradually increases as the number of the substrates on which the ITO film is formed increases. In a continuous sputtering process, a transparent conductive ITO film having the same resistivity cannot be formed on each sequentially processed substrate. That is, the continuous sputtering process causes a problem in that the resistivity increases as sputtering proceeds to sequentially form the ITO film on substrates.

FIG. 2 shows a graph of the characteristics of the change in the films resistivity to cumulative power supplied to the target when transparent conductive ITO films are formed on a plurality of substrates by the continuous DC magnetron sputtering process. In the example, the target was a disk-shaped mixed sintered material (density of 95%) of $In_2O_3$ to which 10 wt % of $SnO_2$ is added and having a diameter of 8 inches ($\phi$ 8"). The ITO film was formed on a substrate heated to 200° C. at a power of 300 W and under a pressure of $3 \times 10^{-3}$ Torr. The sputtering gas was a mixture of argon (Ar) and oxygen ($O_2$) gases. The partial pressure of the oxygen in the sputtering gas was adjusted to be within a range of from $6 \times 10^{-5}$ to $1.5 \times 10^{-4}$ to minimize resistivity every time a constant power (3 kWh) is cumulated. As clearly seen from FIG. 2, the resistivity of the film increased as the cumulative power increased.

When transparent conductive ITO films are formed on a number of substrates by the continuous DC magnetron sputtering process, the conventional sputtering process cannot provide uniform resistivity for each substrate, as shown in FIG. 2. In conventional film formation processes, to maintain the resistivity of each substrate to within a range where the performance of the device is guaranteed, it is necessary to grind the surface of the target, or to replace the target itself before the potential end of its life. This prevents the productivity from being improved, so that the manufacturing cost is increased.

Although FIG. 2 shows that the resistivity increases as the cumulative power increases in a case where transparent conductive ITO films are formed on a plurality of substrates by continuous sputtering, strictly speaking, such increase of the resistivity of the film for the cumulative power may occur even when forming a film on one substrate. That is, the resistivity gradually increases in the direction of film thickness even on a transparent conductive ITO film formed on one substrate. Therefore, when it is intended to form a film with considerable thickness on a substrate, there also arises a problem that the resistivity of entire film increases as the film becomes thicker.

An object of the present invention is to provide a method capable of fabricating a transparent conductive ITO film with resistivity within a predetermined range until the end of the life of the target when transparent conductive ITO films are continuously formed on a plurality of substrates by continuous sputtering, and capable of fabricating a transparent conductive ITO film with resistivity being within a predetermined range even when the film becomes thicker in forming it on a single substrate.

To attain the above object, the method for fabricating a transparent conductive ITO film according to the first feature of the present invention is a method for fabricating a transparent conductive ITO film which has In and O as basic component elements and which is added with Sn as a donor, in an atmosphere of a mixture of rare gas and oxygen gas by a sputtering process using a mixture of oxides of In and Sn as a target wherein it comprises a first step of forming a transparent conductive ITO film on a substrate, and a second step of interrupting the first step and performing discharge in a state with a partial pressure of oxygen higher than that in the first step to compensate for the oxygen deficiency in the target, the first and second steps being repeated alternately.

The method according to the second feature of the present invention is a method according to the first feature wherein a transparent conductive ITO film is continuously formed on each of a plurality of substrates by the first step, and then the second step is performed.

The method according to the third feature of the present invention is a method according to the first feature wherein the first and second steps are repeated alternately for one substrate.

The method according to the fourth feature of the present invention is a method according to any one of the first to third features wherein the partial pressure of oxygen in the second step is $1\times10^{-3}$ Torr or more.

The method according to the fifth feature of the present invention is a method according to the fourth feature wherein the second step is performed in an atmosphere where introduction of the rare gas is stopped and only oxygen gas is introduced.

The method according to the sixth feature of the present invention is a method according to any one of the first to fifth features wherein the process interrupts the first step when the resistivity of the transparent conductive ITO film becomes higher than a set value, and enters in the second step, performs the second step for a predetermined period of time, then restarts the first step, and alternately repeats the first and second steps in the same manner.

According to the first feature of the present invention, because oxygen deficiency in the target is compensated in the second step where oxygen is deficient due to film formation in the first step, the amount of active oxygen generating from the target is restored when the transparent conductive ITO film is formed again by the first step, so that the resistivity of the formed film is lowered.

According to the second feature of the present invention, because the second step is arranged to be performed after the film formation by the first step in continuously forming on a plurality of substrates by continuous sputtering, it possible to lower the resistivity of the film formed on each substrate so that it is maintained to be within a desired range.

According to the third feature of the present invention, because the first and second steps are repeated alternately for a single substrate, it is possible, in forming the film on a single substrate to lower the resistivity by reducing the thickness of the film.

According to the fourth feature of the present invention, because the partial pressure of oxygen in the second step is set to $1\times10^{-3}$ Torr or more, the following effects occur.

For example, the etch rate at a portion of a target which is most etched in fabricating a transparent conductive ITO film by the DC magnetron sputtering process is as much as 20 nm/sec depending on the power applied to the target, or the intensity or shape of the magnetic field over the target surface. This speed is about 100 atomic layers per second since the inter-atomic distance of ITO is about 2 Å. The probability of sticking oxygen to the target can be estimated to be about 0.1 from the data on oxygen stacking to the oxide surface and the process of experiments in developing the present invention. Then, about 100 atomic layers would be formed in one second at the oxygen partial pressure of $1\times10^{-3}$ Torr (the oxygen does not actually form a layer, but it is assumed that one is formed), which is substantially equal to the etching rate for the target. Therefore, if the oxygen partial pressure is increased to over $1\times10^{-3}$ Torr, the stacking rate of oxygen on the target surface becomes higher than the rate of the release of oxygen by the selective sputtering of oxygen atoms or rise in surface temperature.

In addition, the target surface has higher temperature during sputtering due to ion bombardment. Thus, while some of the oxygen particles sticking on the target surface or oxygen particles ionized in the plasma, bombarding the target and remaining therein would be released, the remainder would diffuse into the target. As described above, by sputtering at the oxygen partial pressure of over $1\times10^{-3}$ Torr, oxygen can be sufficiently supplied to the oxygen-deficient layer superficially formed in the target during film formation, so that the oxygen concentration in the deficiency layer can be restored to substantially equal to the initial value. Thus, the resistivity which was increased during film formation is returned to the initial value.

According to the fifth feature of the present invention, the oxidizing speed of the target can be increased by stopping the introduction of rare gas causing selective sputtering, which is a cause of oxygen deficiency on the target surface, during the second step for compensating for oxygen deficiency in the target, and by performing discharge only with oxygen gas so that the time for the second step for compensating oxygen for the oxygen-deficient layer can be shortened.

According to the sixth feature of the present invention, the process interrupts the first step, based on the fact that the resistivity of the transparent conductive ITO film fabricated in the first step becomes higher than the set value, proceeds to the second step which compensates for the oxygen deficiency in the target, and repeats the first and second steps so that the transparent conductive ITO films having a resistivity of within a predetermined range can be obtained until the end of the life of the target even if they are fabricated on a plurality of substrates by continuous sputtering. Also, in the case of film formation on a single substrate, it is possible to obtain the transparent conductive ITO film having a resistivity of within a predetermined range even if the film thickness is increased.

DESCRIPTION OF THE PREFERRED EMBODIMENTS

Preferred embodiments of the present invention will be explained with reference to the attached drawings in the following.

First, explained is the basis for the method for fabricating a transparent conductive ITO film according to the present invention. When a transparent conductive ITO film is fabricated on two or more substrates by performing continuous sputtering, for example, from one substrate to another, a problem arises in that the resistivity increases as sputtering proceeds. Through analysis and studies by the inventor on the cause of this problem, the inventor has found that continuous sputtering gradually decreases the oxygen concentration in the superficial layer in the target. The gradual decrease in the oxygen concentration in the superficial layer is caused by oxygen being released from the superficial layer by the rise in the surface temperature due to ion bombardment during sputtering or by oxygen-selective sputtering. In addition, in the target, oxygen existing in its inside diffuses into the oxygen-deficient layer, so that the oxygen-deficient layer becomes deeper and deeper as sputtering proceeds.

Furthermore, oxygen particles sputtered from the surface of the target contains those in atomic state. As the atomic oxygen particles is more active than oxygen molecules introduced into the sputtering gas, the atomic particles of oxygen contribute to improving the crystalline characteristics in crystal growth in film formation. Therefore, the larger the amount of atomic particles of oxygen sputtered from the target is, the lower is the resistivity of the film.

Figure 2:
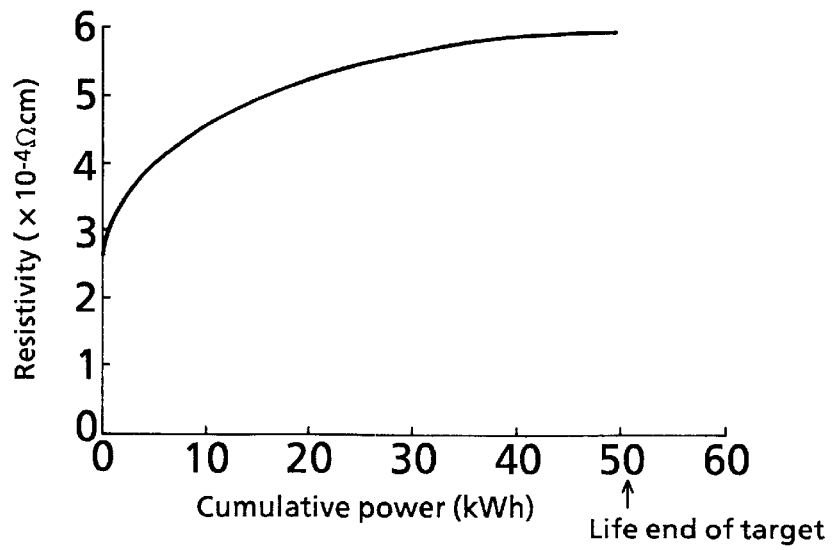
FIG. 2 is a graph showing changes in the resistivity of a film to cumulative power for a transparent conductive ITO film fabricated by a conventional method.

The conventional film formation method having the characteristics shown in FIG. 2 by continuous sputtering adjusts the amount of oxygen being introduced to minimize the resistivity of the film at a certain point of time in any cumulative power. The minimum value of the resistivity did not approach the initial value when the target was initially used. This is because oxygen becomes deficient in the target, and the amount of atomic particle of oxygen sputtered from the target is decreased. In addition, the conventional film formation method with continuous sputtering has introduced a suitable amount of oxygen gas (normally, several percent) into the sputtering gas. It is believed that parts of oxygen gas introduced in the sputtering gas contribute to the oxidation of the target surface, and to the oxygen particles are supplied to the target surface. However, in the conventional film formation method, the resistivity of film increases as the cumulative power increases as shown in FIG. 2. This is because, in such amount of oxygen introduction, the release of oxygen due to oxygen-selective sputtering or a rise in surface temperature is faster than the oxidation of the target by introduced oxygen, ultimately leading to a superficial oxygen-deficient layer in the target.

Based on the above line of reasoning, the exemplary embodiment arranges for a method for fabricating the transparent conductive ITO film by a sputtering process as follows.

In a case where transparent conductive ITO films are formed by sputtering oxides of In and Sn such as a mixed sintered material is used as the target placed in a vacuum processing chamber, and a transparent conductive ITO film is formed in an atmosphere which contains a rare gas such as argon gas, and in which a suitable amount of oxygen gas is introduced, which is described later. The process for forming a film on a plurality of substrates comprises a first step where thin films are formed on a plurality of substrates through continuous sputtering, and a second step which interrupts the first step based on the criteria, which is described later, and performs discharge in a state with a partial pressure of oxygen gas higher than that in the film formation to compensate deficiency of oxygen in the target. Oxygen becomes deficient in the first step where the film is formed by sputtering, but sufficient oxygen is supplied to the target surface through oxygen discharge in the second step.

In a case where a film is formed on a number of substrates (usually, a plurality of substrates which means two or more substrates) one after another, the first step for continuously forming films on a number of substrates and then the second step are performed. A set of the first and then second steps represents one cycle, and the first and second steps are alternately repeated. In the film formation step, the first step, the transparent conductive ITO film is formed by continuous sputtering on a plurality of substrates one after another. After performing the first step, the second step is carried out under predetermined criteria. According to the method for fabricating the transparent conductive ITO film, it is possible to avoid an increase in the resistivity of the transparent conductive ITO film as sputtering proceeds, and to maintain the resistivity of the transparent conductive ITO film formed on each substrate to within a desired range.

Figure 1:
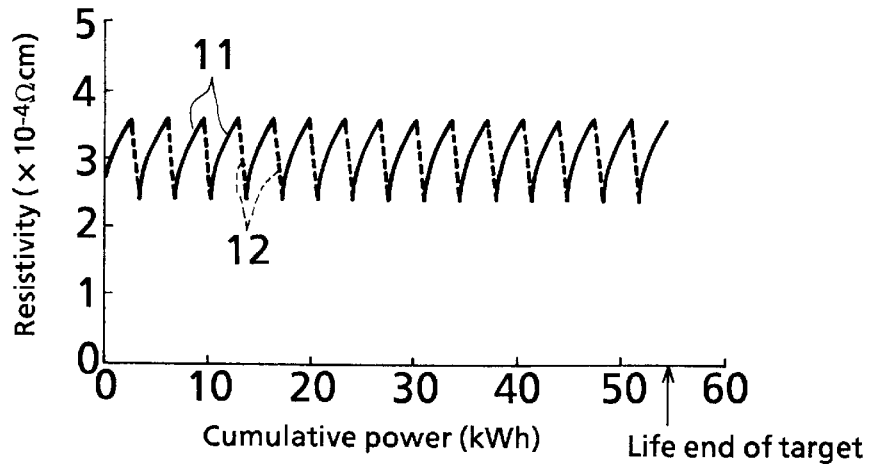
FIG. 1 is a graph showing changes in the resistivity of a film to cumulative power for a transparent conductive ITO film fabricated by the method of the present invention.

FIG. 1 is a graph illustrating changes in the resistivity of a film to cumulative power supplied to the target in a case where the transparent conductive ITO films are continuously formed on a plurality of substrates one after another by continuously using the DC magnetron sputtering process in the method according to the above-mentioned embodiment.

In the exemplary embodiment, a target was a disk-shaped sintered material target (density 95%) with a diameter of 8 inches ($\phi$ 8") in which 10 wt % $SnO_2$ is added to $In_2O_3$. The first step was performed at a pressure of $3 \times 10^{-3}$ Torr by introducing 2% of oxygen gas ($O_2$) into argon gas (Ar gas) (partial pressure of oxygen being $6 \times 10^{-5}$) to minimize the resistivity, and continued on a plurality of substrates heated to 200° C. with a power of 300 W until the resistivity reached $3.7 \times 10^{-4}$ $\Omega$cm. The second step of supplying oxygen in the superficial oxygen deficient layer in the target formed during the first step was performed at a pressure of $3 \times 10^{-3}$ Torr and a power of 1 kW for 30 minutes by stopping the introduction of Ar gas and only introducing oxygen gas. The solid line 11 in FIG. 1 indicates the change in the resistivity of the film in the first step, while the dotted line 12 indicates that the resistivity of the film returns to the initial value during the second step. In FIG. 1, the end of the life of target is extended from the example shown in FIG. 2. This is because rare gas was not introduced in the second step so that the target was little etched.

As shown in FIG. 1, the superficial oxygen-deficient layer in the target formed during the first step is also compensated through the second step where sputtering is performed at a pressure of $3 \times 10^{-3}$ Torr by only introducing oxygen gas, and the resistivity which has been increased in the first step can be returned to a value substantially equal to the initial value. Then, it is possible to obtain a transparent conductive ITO film which has a resistivity of within a predetermined range (in the exemplary embodiment, a range from $2.4 \times 10^{-4}$ $\Omega$cm to $3.7 \times 10^{-4}$ $\Omega$cm) until the end of the life of the target by repeating alternately the first and second steps.

In the exemplary embodiment, the second step for compensating oxygen for the oxygen-deficient layer formed during the first step performs discharge at a pressure of $3 \times 10^{-3}$ Torr and a power of 1 kW for 30 minutes by only introducing oxygen gas to return the resistivity to the initial value. To return the resistivity to the initial value, it is sufficient if the partial pressure of oxygen gas in the second step is $1 \times 10^{-3}$ Torr. Then, the discharge atmosphere may be one of mixed oxygen gas with rare gas, such as Ar gas. However, because the second step of compensating for the deficient oxygen takes considerable time if it is carried out at a reduced partial pressure of oxygen or in a mixed gas atmosphere with Ar gas or an other rare gas, it is desirable in practice to perform the second step in an atmosphere of primarily oxygen gas by stopping introduction of Ar gas and at a high pressure of $1 \times 10^{-3}$ Torr or more. The power may be that which allows discharge, and is not limited that used in the exemplary embodiment.

Also, although, in the exemplary embodiment, the first step is performed until the resistivity of film reaches $3.7 \times 10^{-4}$ Ωcm, the setting of resistivity threshold may be a value in a range guaranteeing the performance of the device, and is not limited to that of the exemplary embodiment. In other words, the timing of the switch or shift between the first step and the second step is may be dependant on when the resistivity of the transparent conductive ITO film reaches an upper limit of the resistivity required to assure the performance of a device, such as a liquid crystal display or a solar battery, in which a transparent conductive ITO film is used as an electrode. However, lower resistivity set value can provide advantages in that it make the range of resistivity of the obtained film narrower, and that the time required for the second step of compensating for the deficient oxygen in the target can be shortened.

In the exemplary embodiment described above, although the transition from the first step to the second step is performed by confirming that the resistivity of film reaches the set value during the first step, it may be performed based on the duration for the first step or accumulated thickness of the film being fabricated in the first step. Incidentally, the time when the resistivity of film reaches $3.7 \times 10^{-4}$ Ωcm in the first step is about 10 hours.

The material, shape, size and the type of the target are not limited to those of the above described exemplary embodiment. The method for fabricating a transparent conductive ITO film according to the present invention may be applied to a target with different added amounts of $SnO_2$, of a rectangle or oval shape, only pressed instead of being made of sintered material, or with a different density.

Although the embodiment described above is described for a case where the DC magnetron sputtering process, the method for fabricating the thin film may be applied to a sputtering process moving a magnet positioned behind a target, a sputtering process of the RF discharge type, or a simplified sputtering process without a magnet positioned behind the target. These sputtering processes enable it to fabricate a transparent conductive ITO film having a resistivity of within a predetermined range until the end of the life of the target.

The exemplary embodiment described above is for a method which alternately repeats the first step for continuously forming transparent conductive ITO films on a plurality of substrates one after another, and the second step for interrupting the first step under predetermined criteria and performing discharge at a state with a partial pressure of oxygen higher than that used in forming the thin film to compensate for the oxygen deficiency in the target. However, when the first and second steps are alternately repeated for a single (one) substrate to form a film on the same substrate, in view of the exemplary embodiment shown in FIG. 1, it can be easily supposed that the resistivity of the film being fabricated repeatedly changes of from $2.4 \times 10^{-4}$ Ωcm to $3.7 \times 10^{-4}$ Ωcm in the direction of the film thickness. In addition, when films are continuously formed on a single substrate without the second step, in view of the exemplary example shown in FIG. 2, it can be easily supposed that the resistivity of the film being fabricated is increased from $2.4 \times 10^{-4}$ Ωcm to a value higher than $3.7 \times 10^{-4}$ Ωcm in the direction of the film thickness. When both films are compared, it is clear that the former film has lower resistivity than the latter as a whole. Thus, even in the film formation on a single substrate, the increase in the resistivity of the film can be suppressed even if the film thickness is increased by repeating the first step for forming the film with sputtering and the second step for compensating for the oxygen deficiency in the target. In addition, a transparent conductive ITO film with a resistivity of within a predetermined range can be fabricated by performing a transition from the first step to the second step while setting the resistivity. Thus, the method of alternately repeating the first step for forming the film and the second step for compensating for the oxygen deficiency in the target is effective in a case where the reduction of the resistivity of the film or uniform resistivity in the direction of film thickness is required.

Although the method for fabricating the transparent conductive ITO film according to each exemplary embodiment described above is described assuming sputtering process for a single sheet, the method for fabricating the transparent conductive ITO film according to the present invention can be easily applied to an in-line film formation process.

As seen from the above, the present invention provides the following advantages.

As the present invention repeats the first step for continuously forming a thin film on each of a plurality of substrates by continuous sputtering and the second step for interrupting the first step and performing discharge at a partial pressure of oxygen higher than that in the first step to compensate for the deficient oxygen in the target, the second step can compensate deficiency of oxygen in the target caused in the first step, so that the surface region of target can be maintained at an oxygen concentration nearly equal to that of the initial state. Thus, even if the transparent conductive ITO films are fabricated on a plurality of substrates by continuous sputtering, they can be fabricated with a resistivity in a predetermined range, and the target can be used until the end of its life.

In addition, according to the present invention, even in the formation of transparent conductive ITO film on a single substrate, the increase of resistivity can be reduced in the direction of film thickness by alternately repeating the first step of forming the film by sputtering and the second step of compensating for superficial oxygen deficiency layer in the target. Thus, a transparent conductive ITO film with resistivity within a predetermined range can be obtained even if the film thickness increases.

Furthermore, as the second step is arranged to be performed in an atmosphere in which only oxygen gas is introduced while stopping the introduction of rare gas to make the partial pressure of oxygen $1 \times 10^{-3}$ Torr or more, the second step can indeed effectively compensate for the superficial oxygen deficiency layer in the target caused in the first step so that the surface region of target can be maintained at an oxygen concentration of nearly equal to that of the initial state.

According to the present invention, as the process is arranged to be switched from the first step to the second step based on the value of the resistivity caused in the first step, even if transparent conductive ITO films are fabricated on a plurality of substrates by continuous sputtering, the transparent conductive ITO films with a resistivity within a predetermined range can be obtained until the end of the life of the target. Also, in the case of film formation on a single substrate, it is possible to obtain a transparent conductive ITO film with a resistivity within a predetermined range even if the film thickness is increased.

What is claimed is:

1. In a method for fabricating a transparent conductive ITO film which has In and O as basic component elements and Sn added as a donor in an atmosphere comprising a mixture of rare gas and oxygen gas by a sputtering process using a mixture of oxides of In and Sn as a target, said method comprising:

a first step of forming by sputtering a transparent conductive ITO film on a substrate in an atmosphere with a partial pressure of oxygen set by introducing oxygen gas into the rare gas, and a second step of interrupting said forming in said first step and performing discharge in an atmosphere where a partial pressure of oxygen is $1 \times 10^{-3}$ Torr or more, which is higher than the partial pressure of oxygen in said first step, wherein a stacking rate of oxygen on a target surface becomes higher than that of a release of oxygen on the target surface to compensate for the oxygen deficiency in said target.

2. A method for fabricating a transparent conductive ITO film according to claim 1, wherein said transparent conductive ITO film is continuously formed on each of a plurality of substrates by said first step, and then said second step is performed.

3. A method for fabricating a transparent conductive ITO film according to claim 1, wherein said first and second steps are alternately repeated for fabricating a transparent conductive ITO film on one substrate.

4. A method for fabricating a transparent conductive ITO film according to claim 3, wherein the process interrupts said first step when resistivity of said transparent conductive ITO film becomes higher than a set value, and transfers to said second step, performs said second step for a predetermined period of time, then restarts said first step, and alternately repeats said first and second steps.

5. A method for fabricating a transparent conductive ITO film according to claim 4, wherein said set value is $3.7 \times 10^{-4}$ Ωcm.

6. A method for fabricating a transparent conductive ITO film according to claim 4, wherein said predetermined period of time is about 30 minutes.

7. A method for fabricating a transparent conductive ITO film according to claim 1, wherein the method interrupts said first step when resistivity of said transparent conductive ITO film becomes higher than a set value, and switches to said second step, performs said second step for a predetermined period of time, then switches back to said first step, and alternately repeats said first and second steps.

8. A method for fabricating a transparent conductive ITO film according to claim 7, wherein said set value is $3.7 \times 10^{-4}$ Ωcm.

9. A method for fabricating a transparent conductive ITO film according to claim 7, wherein said predetermined period of time is about 30 minutes.

10. A method for fabricating a transparent conductive ITO film according to claim 1, wherein the method interrupts said first step when a first predetermined period of time has elapsed, performs said second step for a second predetermined period of time, then switches back to said first step, and alternatively repeats said first and second steps.

11. A method for fabricating a transparent conductive ITO film according to claim 10, wherein said second predetermined period of time is about 30 minutes.

12. A method for fabricating a transparent conductive ITO film according to claim 10, wherein said first predetermined period of time is about 10 hours.

13. A method for fabricating a transparent conductive ITO film according to claim 11, wherein said first predetermined period of time is about 10 hours.

* * * * *

UNITED STATES PATENT AND TRADEMARK OFFICE
CERTIFICATE OF CORRECTION

PATENT NO. : 6,425,990 B1
DATED : July 30, 2002
INVENTOR(S) : Ishibashi

It is certified that error appears in the above-identified patent and that said Letters Patent is hereby corrected as shown below:

Title page,
Item [*] Notice, delete "0" and insert -- 919 --.

Signed and Sealed this

Twenty-eighth Day of September, 2004

JON W. DUDAS
*Director of the United States Patent and Trademark Office*